(12) United States Patent
Hsieh

(10) Patent No.: US 11,744,121 B2
(45) Date of Patent: Aug. 29, 2023

(54) DISPLAY SUBSTRATE, METHOD FOR MANUFACTURING SAME, AND DISPLAY DEVICE

(71) Applicant: BOE Technology Group Co., Ltd., Beijing (CN)

(72) Inventor: Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 205 days.

(21) Appl. No.: 16/923,158

(22) Filed: Jul. 8, 2020

(65) Prior Publication Data

US 2021/0013285 A1 Jan. 14, 2021

(30) Foreign Application Priority Data

Jul. 9, 2019 (CN) .......................... 201910613255.8

(51) Int. Cl.
| | |
|---|---|
| H01L 27/32 | (2006.01) |
| H10K 59/126 | (2023.01) |
| H04N 23/57 | (2023.01) |
| H10K 59/122 | (2023.01) |
| H10K 59/124 | (2023.01) |
| H10K 59/12 | (2023.01) |

(52) U.S. Cl.
CPC ........... *H10K 59/126* (2023.02); *H04N 23/57* (2023.01); *H10K 59/122* (2023.02); *H10K 59/124* (2023.02); *H10K 59/1201* (2023.02)

(58) Field of Classification Search
CPC ............. H01L 27/3272; H01L 27/3246; H01L 27/3258; H01L 2227/323

USPC ........................................................... 257/91
See application file for complete search history.

(56) References Cited

U.S. PATENT DOCUMENTS

| | | | | |
|---|---|---|---|---|
| 2016/0190389 | A1* | 6/2016 | Lee ................. | A61B 5/0077 438/28 |
| 2016/0369131 | A1* | 12/2016 | Lim ................. | G02B 1/14 |
| 2017/0061193 | A1* | 3/2017 | Young ............. | G06F 3/044 |
| 2017/0287992 | A1 | 10/2017 | Kwak et al. | |
| 2019/0004661 | A1* | 1/2019 | Lee ................. | G01R 31/2891 |
| 2019/0019966 | A1* | 1/2019 | Jiang .............. | H01L 51/5253 |
| 2019/0050094 | A1* | 2/2019 | Zeng .............. | G06F 3/0412 |
| 2019/0130822 | A1* | 5/2019 | Jung .............. | G09G 3/2003 |

FOREIGN PATENT DOCUMENTS

| | | |
|---|---|---|
| CN | 109817675 A | 5/2019 |
| CN | 109935619 A | 6/2019 |

OTHER PUBLICATIONS

English Machine Translation of CN 109935619. (Year: 2019).*
English Machine Translation of CN 109817675. (Year: 2019).*
First office action of Chinese application No. 201910613255.8 dated Jan. 11, 2021.

* cited by examiner

*Primary Examiner* — Dzung Tran
(74) *Attorney, Agent, or Firm* — Lippes Mathias LLP

(57) ABSTRACT

Disclosed are a display substrate, a method for manufacturing the same, and a display device. The display substrate includes: a base substrate, and a multilayered functional film layer on the base substrate. The multilayered functional film layer is provided with an opening penetrating through the multilayered functional film layer. A light-shielding film is on a side wall of the opening.

18 Claims, 5 Drawing Sheets

DISPLAY SUBSTRATE, METHOD FOR MANUFACTURING SAME, AND DISPLAY DEVICE

This application claims priority to Chinese Patent Application No. 201910613255.8, filed with the National Intellectual Property Administration, PRC on Jul. 9, 2019 and titled "DISPLAY SUBSTRATE, METHOD FOR MANUFACTURING SAME, AND DISPLAY DEVICE", the entire contents of which are incorporated herein by reference.

TECHNICAL FIELD

The present disclosure relates to the technical field of display, in particular to a display substrate, a method for manufacturing the same, and a display device.

BACKGROUND

Due to the relatively high screen-to-body ratio (generally reaching 80% or even more than 90%) of a full-screen display device, the size of the display screen may be increased without increasing the overall size of the display device.

Normally, various sensor devices such as cameras need to be placed on the front face of the full-screen display device. In order not to affect the screen-to-body ratio of the full-screen display device, an opening may be in a display substrate of the full-screen display device, then the camera is placed on the back face of the display substrate, and the light incident surface of the camera is enabled to be proximal to the opening. In this case, ambient light is capable of passing through the opening of the display substrate to be incident to the light incident surface of the camera, such that the camera is capable of normally acquiring an image.

SUMMARY

Embodiments of the present disclosure provide a display substrate, a method for manufacturing the same, and a display device. The problem that quality of an image acquired by the camera is poor in the related art may be solved. The technical solutions are as follows.

In one aspect, a display substrate is provided. The display substrate includes:

a base substrate;

a multilayered functional film layer on the base substrate, the multilayered functional film layer being provided with an opening penetrating through the multilayered functional film layer; and a light-shielding film on a side wall of the opening.

Optionally, a size of the opening gradually increases in a first direction, the first direction being a direction perpendicular to a surface of the base substrate provided with the multilayered functional film layer, and distal from the base substrate.

Optionally, the opening includes a plurality of sub-openings sequentially communicated in a lamination direction of the multilayered functional film layer, the plurality of sub-openings being in the multilayered functional film layer in one-to-one correspondence.

Optionally, central axes of the plurality of sub-openings coincide.

Optionally, in the plurality of sub-openings, an area of an opening end surface of a first sub-opening is greater than an area of an opening end surface of a second sub-opening, the first sub-opening being adjacent to the second sub-opening, and the first sub-opening being on one side of the second sub-opening distal from the base substrate.

Optionally, a material of the light-shielding film includes a metal material.

Optionally, the material of the light-shielding film includes any one of silver, aluminum, and an alloy.

Optionally, the display substrate further includes a plurality of pixel driving circuits on the base substrate and light-emitting devices electrically connected to the pixel driving circuits.

Optionally, the multilayered functional film layer includes a buffer layer, a first gate insulating layer, a second gate insulating layer, an interlayer dielectric layer, a planarization layer, and a pixel defining layer which are sequentially laminated on the base substrate.

Optionally, the side wall of the opening is a stepped side wall.

Optionally, the side wall of the opening is a flat side wall.

Optionally, a material of the light-shielding film includes a non-metal material.

Optionally, the material of the light-shielding film includes a black resin.

Optionally, the opening includes a plurality of sub-openings sequentially communicated in a lamination direction of the multilayered functional film layer, the plurality of sub-openings being in the multilayered functional film layer in one-to-one correspondence, in the plurality of sub-openings, an area of an opening end surface of a first sub-opening being greater than an area of an opening end surface of a second sub-opening, the first sub-opening being adjacent to the second sub-opening, the first sub-opening being on one side of the second sub-opening distal from the base substrate, and central axes of the plurality of sub-openings coinciding;

an angle between the side wall of the opening and an opening bottom of the opening is an obtuse angle; and a material of the light-shielding film includes a metal material.

In another aspect, a method for manufacturing a display substrate is provided. The method includes:

forming a multilayered functional film layer on a base substrate;

forming an opening penetrating through the multilayered functional film layer in the multilayered functional film layer; and forming a light-shielding film on a side wall of the opening.

Optionally, forming the opening penetrating through the multilayered functional film layer in the multilayered functional film layer includes:

forming a plurality of sub-openings sequentially communicated in a lamination direction of the multilayered functional film layer in the multilayered functional film layer;

wherein in the plurality of sub-openings, an area of an opening end surface of a first sub-opening is greater than an area of an opening end surface of a second sub-opening, the first sub-opening being adjacent to the second sub-opening, and the first sub-opening being on one side of the second sub-opening distal from the base substrate.

Optionally, forming the plurality of sub-openings sequentially communicated in the lamination direction of the multilayered functional film layer in the multilayered functional film layer includes:

forming the plurality of sub-openings in the multilayered functional film layer by multiple patterning processes;

wherein each patterning process is configured to form one sub-opening.

In still another aspect, a display device is provided. The display device includes a sensor device and a display substrate; wherein the display substrate includes a base substrate, a multilayer functional film layer being provided with an opening penetrating through the multilayered functional film layer, and a light shielding film on a side wall of the opening; the sensor device is on the other side opposite to one side of the base substrate which the multilayered functional film layer is on; and an orthogonal projection of the sensor device on the base substrate at least partially overlaps a region which the opening is on.

Optionally, the sensor device includes a camera, an orthogonal projection of a lens of the camera on the base substrate overlaps the region which the opening is on.

Optionally, the orthogonal projection of the lens of the camera on the base substrate coincides with the region which the opening is on.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objects, technical solutions and advantages in the present disclosure, the embodiments of the present disclosure are described in detail below in combination with the accompanying drawings.

Figure 1:
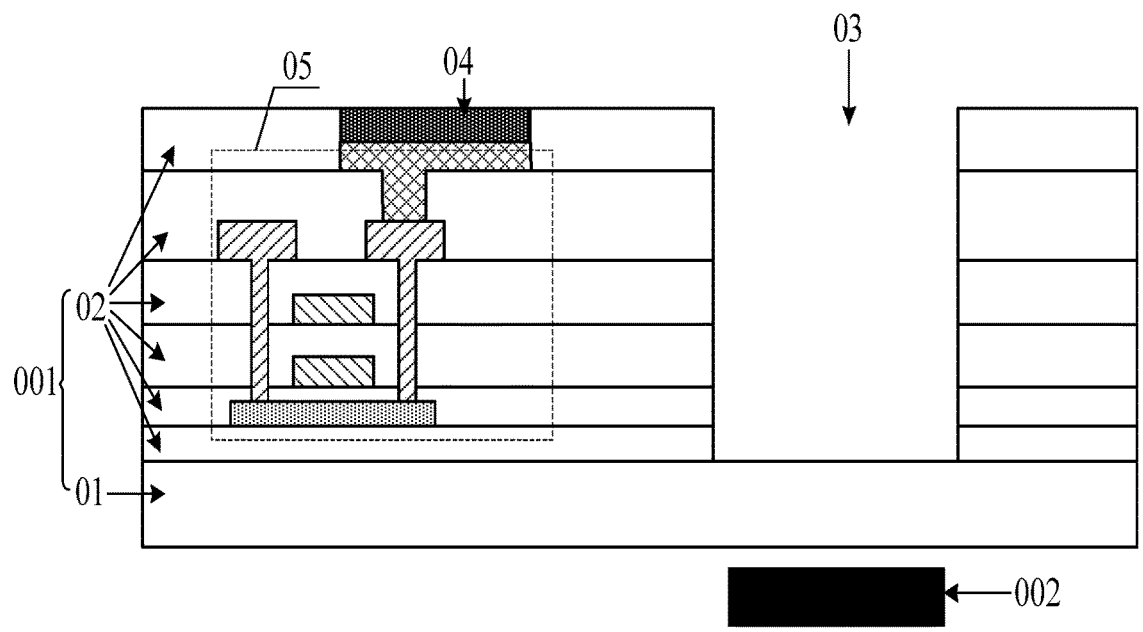
FIG. 1 is a schematic structural diagram of a display device in the related art.

Referring to FIG. 1, FIG. 1 is a schematic structural diagram of a display device at present. The display device may include a display substrate 001 and a camera 002. The display substrate 001 may include a base substrate 01 and a multilayered functional film layer 02 on the base substrate 01. The multilayered functional film layer 02 on the display substrate 00 is provided with an opening 03 penetrating through the multilayered functional film layer 02.

In this case, the camera 002 may be on a back face of the display substrate 001, that is, the camera 002 is on one side of the base substrate 01 which the multilayered functional film layer 02 is on, such that a light incident surface of the camera 002 is proximal to the opening 03. In this way, ambient light is capable of passing through the opening 03 of the display substrate to be incident to the light incident surface of the camera 002, such that the camera 002 is capable of normally acquiring an image.

The display substrate 001 is capable of emitting light. For example, the display substrate 001 may further include an organic light-emitting diode (OLED) light-emitting device 04 on the base substrate 01, and a pixel driving circuit 05 electrically connected to the OLED light-emitting device 04. The pixel driving circuit 05 may control the light emission of the OLED light-emitting device 04.

Figure 2:
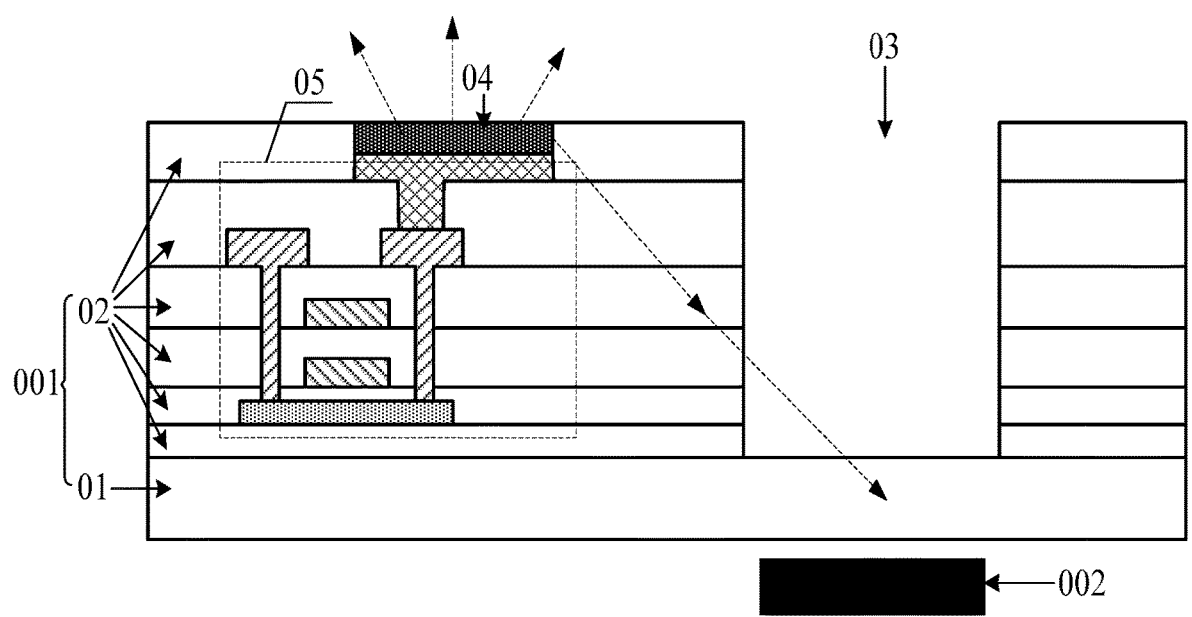
FIG. 2 is a light path diagram of light emitted from the display device shown in FIG. 1.

Referring to FIG. 2, FIG. 2 is a light path diagram of light emitted from the display device shown in FIG. 1. Since the display substrate 001 is capable of emitting light, that is, the OLED light-emitting device 04 in the display substrate 001 is capable of emitting light, the light emitted from the OLED light-emitting device 04 (as indicated by the dotted arrow) is capable of simply passing through the opening 03 to be incident to the light incident surface of the camera 002. As a result, quality of the image acquired by the camera 002 is poor.

For improvement of the quality of the image acquired by the camera 002, it is necessary to increase a size of the opening 03 to prevent the light emitted from the display substrate 001 from directly entering the light incident surface of the camera 002. However, the opening 03 with a larger size may reduce a screen-to-body ratio of the display device provided with the display substrate 001.

Figure 3:
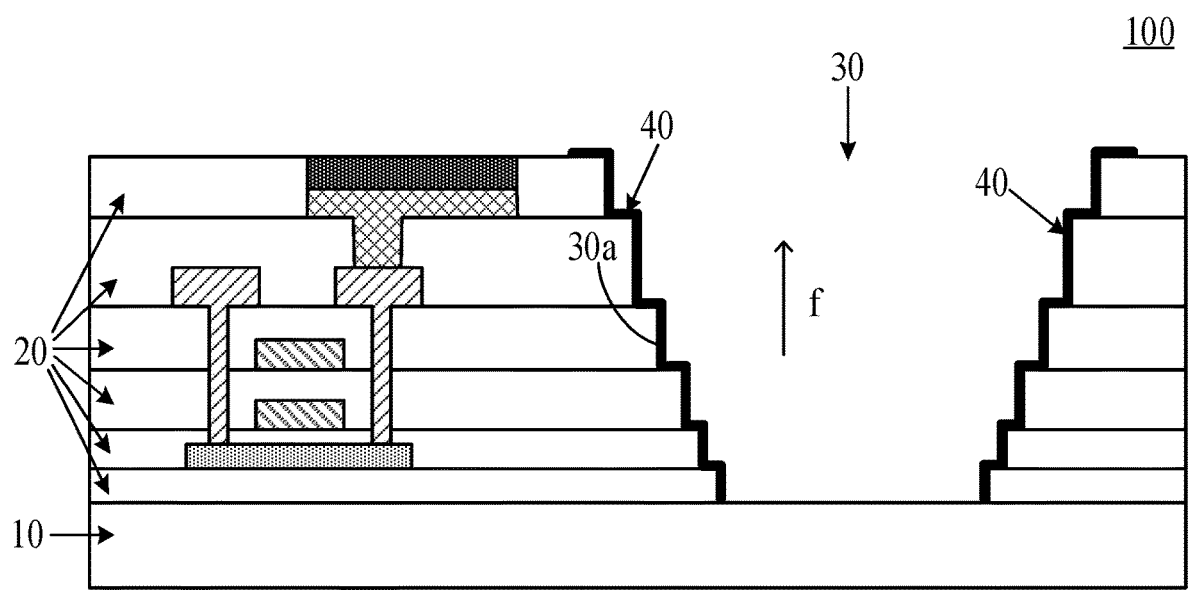
FIG. 3 is a schematic structural diagram of a display substrate according to an embodiment of the present disclosure.

An embodiment of the present disclosure provides a display substrate. As shown in FIG. 3, FIG. 3 is a schematic structural diagram of a display substrate according to an embodiment of the present disclosure.

The display substrate 100 may include a base substrate 10 and a multilayered functional film layer 20 on the base substrate 10. The multilayered functional film layer 20 is provided with an opening 30 penetrating through the multilayered functional film layer 20. The display substrate 100 may further include a light-shielding film 40 on a side wall 30a of the opening 30. FIG. 3 is a schematic illustration by using a stepped side wall as an example of the side wall 30a. In other optional implementations, the side wall 30a may also be an inclined side wall, for example, a flat or smooth side wall.

Figure 4:
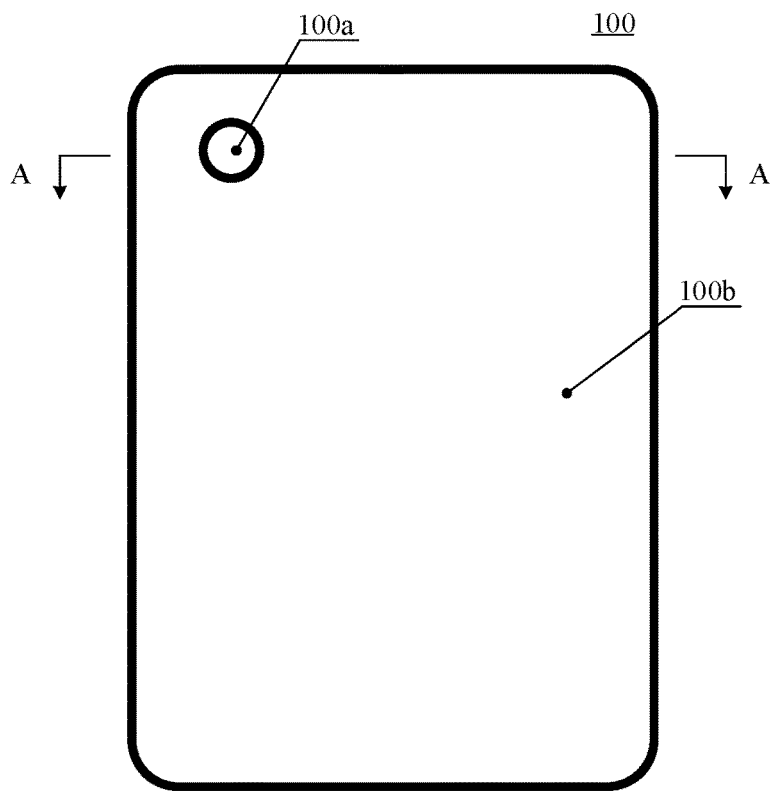
FIG. 4 is a top view of the display substrate shown in FIG. 3.

It should be noted that, referring to FIG. 4 which is a top view of the display substrate shown in FIG. 3 (correspondingly, FIG. 3 is a cross-sectional view of FIG. 4 at A-A), the display substrate 100 is provided with an opening region 100a and a display region 100b, wherein the opening region 100a is a region which the opening is on, and the display region 100b is a region where the display substrate 100 is capable of emitting light.

Figure 5:
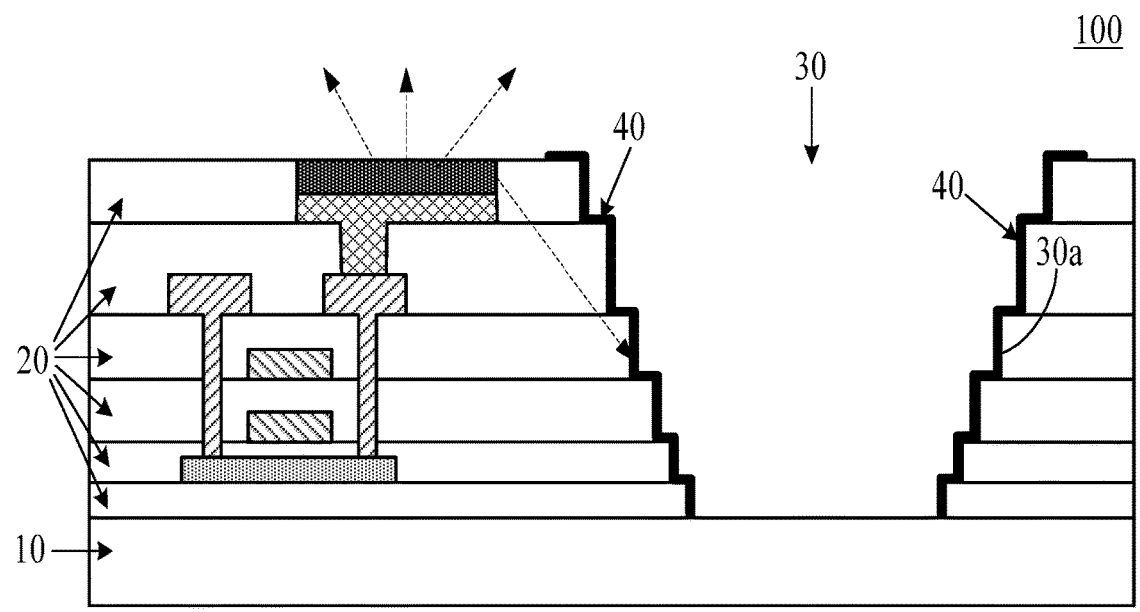
FIG. 5 is a light path diagram of light emitted from the display substrate shown in FIG. 3.

In the embodiment of the present disclosure, referring to FIG. 5 which is an optical path diagram of the light emitted from the display substrate shown in FIG. 3, the light incident to the opening 30 from the display substrate 100 may be blocked by the light-shielding film 40, thereby preventing the light incident to the opening 30 from entering the opening 30.

In summary, the display substrate according to the embodiment of the present disclosure includes a base substrate and a multilayered functional film layer on the base substrate. The multilayered functional film layer is provided with an opening penetrating through the multilayered functional film layer. A light-shielding film is on the side wall of the opening. When the display substrate emits light, the light incident to the opening from the display substrate may be blocked by the light-shielding film. Therefore, the light emitted from the display substrate may be prevented from being incident to the opening without increasing the opening, such that the image quality acquired by the camera in the display device made of the display substrate is relatively high without affecting the screen-to-body ratio of the display device.

Optionally, in the embodiment of the present disclosure, the size of the opening gradually increases in a first direction f, wherein the first direction f is a direction perpendicular to a surface of the base substrate 10 provided with the multilayered functional film layer 20, and distal from the base substrate 10. With such a structure, the light-shielding film 40 may be more simply attached to the side wall of the opening.

In the embodiment of the present disclosure, for the sake of preventing the light-shielding film 40 on the side wall 30a of the opening 30 from breaking, it is necessary to ensure that the light-shielding film 40 may be attached to each position on the side wall of the opening 30. The embodiment of the present disclosure takes the following two implementations as examples for illustrative description.

Figure 6:
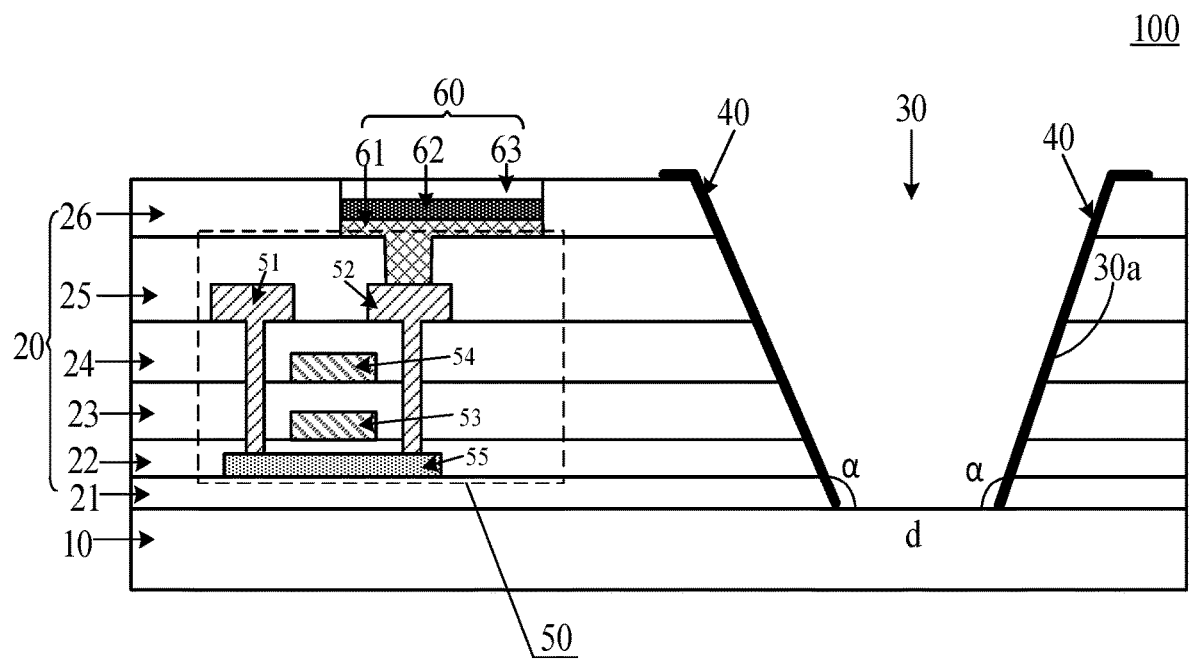
FIG. 6 is a schematic structural diagram of another display substrate according to an embodiment of the present disclosure.

In the first implementation, as shown in FIG. 6 which is a schematic structural diagram of another display substrate according to an embodiment of the present disclosure, when the side wall 30a of the opening 30 in the display substrate 100 is an inclined and flat side wall, an angle α between the side wall 30a of the opening 30 and the opening bottom d of the opening 30 is an obtuse angle. In this case, the inclined side wall of the opening 30 is capable of buffering the light-shielding film 40, such that the light-shielding film 40 may be attached to each position on the side wall of the opening 30. Therefore, the light-shielding film 40 is prevented from breaking and the light-shielding film 40 may be more simply formed on the side wall 30a of the opening 30.

Figure 7:
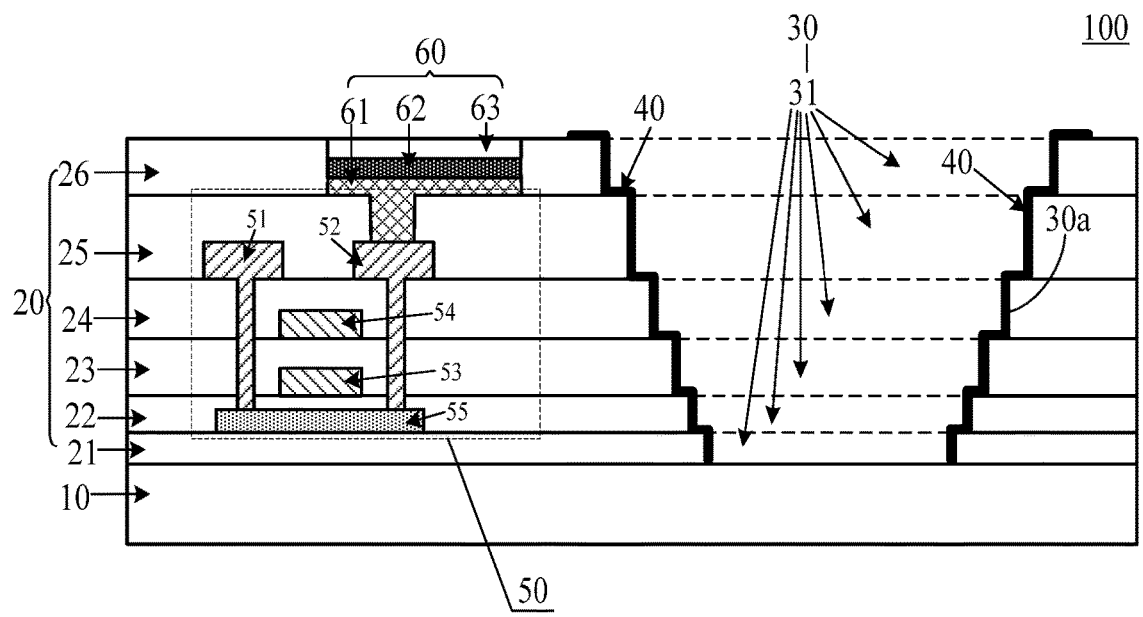
FIG. 7 is a schematic structural diagram of yet another display substrate according to an embodiment of the present disclosure.

In the second implementation, as shown in FIG. 7 which is a schematic structural diagram of yet another display substrate according to an embodiment of the present disclosure, when the side wall 30a of the opening 30 is a stepped side wall, the opening 30 in the display substrate 100 may include a plurality of sub-openings 31 sequentially communicated in a lamination direction of the multilayered functional film layer 20. The plurality of sub-openings 31 are in the multilayered functional film layer 20 in one-to-one correspondence, that is, each functional film layer 20 is provided with one sub-opening 31. The area of the opening end surface of each sub-opening 31 gradually increases in a direction distal from the base substrate 10, that is, in the plurality of sub-openings 31, the area of the opening end surface of a first sub-opening is greater than the area of the opening end surface of a second sub-opening, the first sub-opening is adjacent to the second sub-opening, and the first sub-opening is on one side of the second sub-opening distal from the base substrate. That is, in any two adjacent sub-openings 31, the opening area of the sub-opening 31 proximal to the base substrate 10 is less than the opening area of the sub-opening 31 distal from the base substrate 10. In this case, the stepped side wall of the opening 30 may reduce a step difference of the opening 30 in the depth direction of the opening 30, such that the light-shielding film 40 may be attached to each position on the side wall of the opening 30 to avoid the phenomenon that the light-shielding film 40 is broken. Besides, the light-shielding film 40 may be more simply formed on the side wall 30a of the opening 30.

In an embodiment of the present disclosure, the central axes of the plurality of sub-openings 31 in the opening 30 coincide. In this case, a thickness of the light-shielding film 40 on the side wall 30a of the opening 30 may be the same, thereby simplifying the formation process of the light-shielding film 40 on the side wall 30a of the opening 30.

As shown in FIG. 6 and FIG. 7, in one implementation, a material of the light-shielding film 40 may include a metal material such as silver, aluminum, or an alloy. In another implementation, the material of the light-shielding film 40 may further include a non-metallic material such as a black resin.

In the embodiment of the present disclosure, as shown in FIG. 6 and FIG. 7, the display substrate 100 may further include a plurality of pixel driving circuits 50 which are on the base substrate 10 and a light-emitting device 60 electrically connected to each pixel driving circuit 50. In the embodiment of the present disclosure, the display substrate 100 may emit light by using the light-emitting device 60 therein.

Exemplarily, the light-emitting device 60 may be an OLED light-emitting device. The OLED light-emitting device may include an anode 61, an organic light-emitting layer 62, and a cathode 63 which are sequentially laminated. The pixel driving circuit 50 may be electrically connected to the anode 61 in the OLED light-emitting device, and the pixel driving circuit 50 may load a voltage to the anode 61, such that the anode 61 is capable of driving the organic light-emitting layer 62 to emit light.

Optionally, the pixel driving circuit 50 may include a thin film transistor (TFT). Exemplarily, the TFT may be a double-gate TFT of the top gate type. In this case, the TFT may include a first electrode 51, a second electrode 52, a first gate 53, a second gate 54, and an active layer 55. The second electrode 52 in the TFT may be electrically connected to the anode 61 in the OELD light-emitting device.

It should be noted that in order to distinguish the two electrodes of the TFT other than the gates, the source in the TFT may be called a first electrode, and the drain may be called a second electrode; or, the drain in the TFT may be called the first electrode, and the source is called the second electrode, which is not limited by the present embodiment of the present disclosure.

It should also be noted that under normal circumstances, the pixel driving circuit may include two TFTs and a storage capacitor, and FIG. 6 and FIG. 7 only show the structure of one TFT in the pixel driving circuit.

It should be further noted that the embodiment of the present disclosure takes the double-gate TFT of the top gate type as an example for illustrative description. In other implementations, the TFT may also be a single-gate TFT of the top gate type, a double-gate TFT of a bottom gate type or a single-gate TFT of the bottom gate type, which is not limited by the present embodiment of the present disclosure.

Exemplarily, when the TFT in the pixel driving circuit 50 is a double-gate TFT of the top gate type and the light-emitting device 60 is an OLED light-emitting device, the multilayered functional film layer 20 in the display substrate 50 may include a buffer layer 21, a first gate insulating layer 22, a second gate insulating layer 23, an interlayer dielectric layer 24, a planarization layer 25, and a pixel defining layer 26 which are sequentially laminated on the base substrate 10.

Optionally, the base substrate in the embodiment of the present disclosure may be a flexible base substrate. Furthermore, the display substrate may be a flexible display substrate.

In summary, the display substrate according to the embodiment of the present disclosure includes a base substrate and a multilayered functional film layer on the base substrate. The multilayered functional film layer has an opening penetrating through the multilayered functional film layer. A light-shielding film is on the side wall of the opening. When the display substrate emits light, the light incident to the opening from the display substrate may be blocked by the light-shielding film. Therefore, the light emitted from the display substrate may be prevented from being incident to the opening without increasing the opening, such that the image quality acquired by the camera in the display device made of the display substrate is relatively high without affecting the screen-to-body ratio of the display device.

Figure 8:
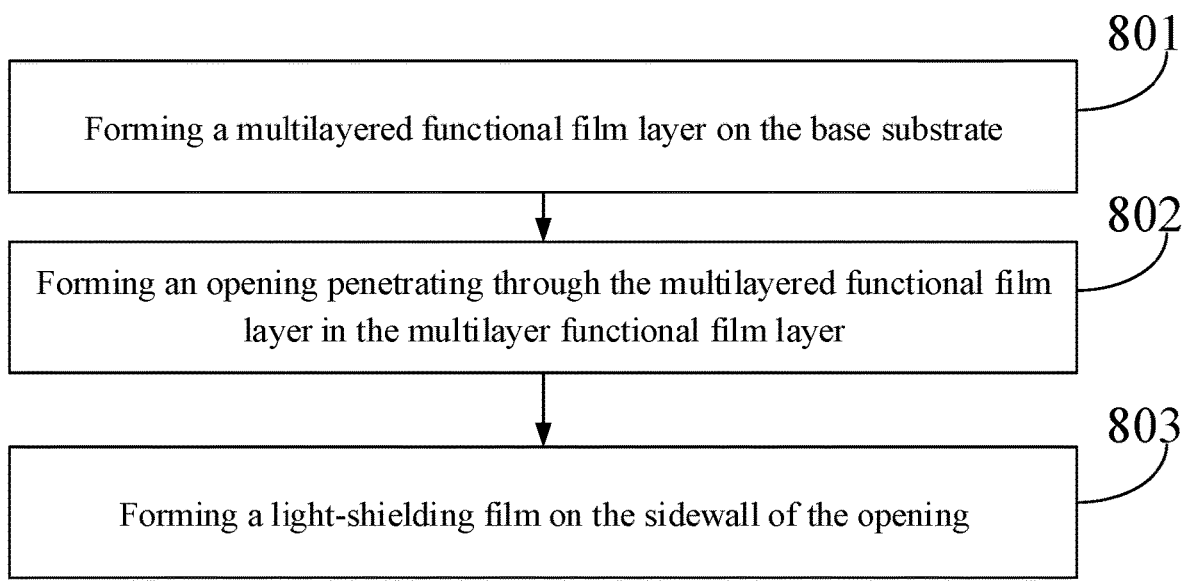
FIG. 8 is a flowchart of a method for manufacturing a display substrate according to an embodiment of the present disclosure.

An embodiment of the present disclosure also provides a method for manufacturing a display substrate. Referring to FIG. 8, FIG. 8 is a flowchart of a method for manufacturing a display substrate according to an embodiment of the present disclosure. The method is configured to manufacture the display substrate shown in FIG. 3, FIG. 6 or FIG. 7. The method for manufacturing the display substrate may include the following steps.

In step 801, a multilayered functional film layer is formed on the base substrate.

In step 802, an opening penetrating through the multilayered functional film layer is formed in the multilayered functional film layer.

In step 803, a light-shielding film is formed on the sidewall of the opening.

In summary, in the method for manufacturing the display substrate according to the embodiment of the present disclosure, a multilayered functional film layer is formed on the base substrate; afterwards an opening penetrating through the multilayered functional film layer is formed in the multilayered functional film layer; and then a light-shielding film is formed on the side wall of the opening. When the display substrate emits light, the light incident to the opening from the display substrate may be blocked by the light-shielding film. Therefore, the light emitted from the display substrate may be prevented from being incident to the opening without increasing the opening, such that the image quality acquired by the camera in the display device made of the display substrate is relatively high without affecting the screen-to-body ratio of the display device.

Figure 9:
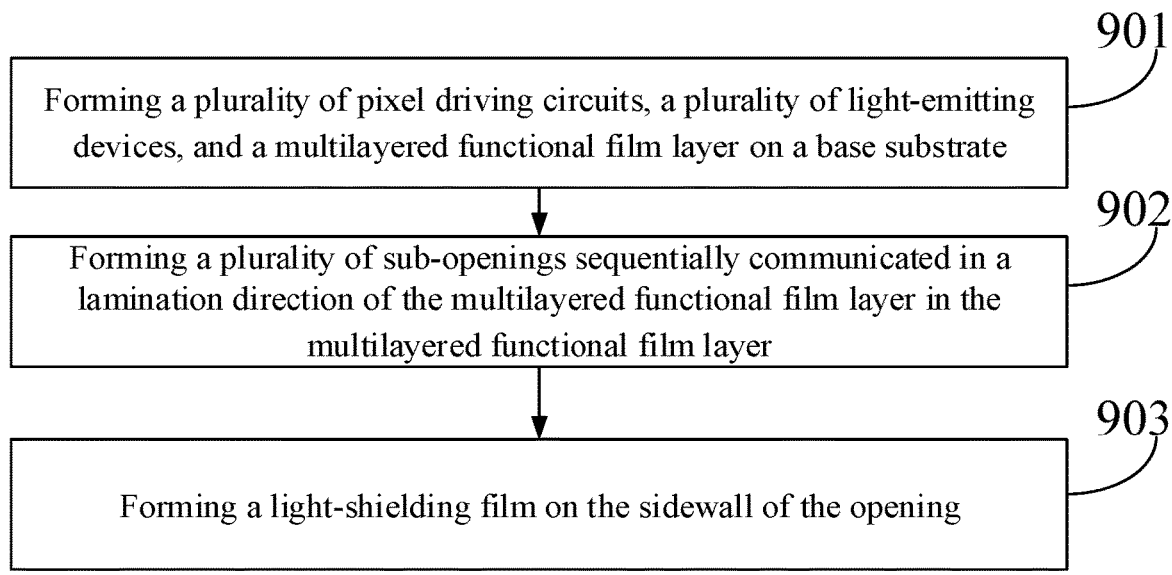
FIG. 9 is a flowchart of another method for manufacturing a display substrate according to an embodiment of the present disclosure.

Referring to FIG. 9, FIG. 9 is a flowchart of another method for manufacturing a display substrate according to an embodiment of the present disclosure. The method is applicable to manufacturing the display substrate shown in FIG. 7. The method for manufacturing the display substrate may include the following steps.

In step 901, a plurality of pixel driving circuits, a plurality of light-emitting devices, and a multilayered functional film layer are formed on the base substrate.

Exemplarily, each pixel driving circuit may be electrically connected to a corresponding light-emitting device. Each pixel driving circuit may include a TFT, which may be a double-gate TFT of a top gate type. Each light-emitting device may be an OLED light-emitting device, and the OLED light-emitting device may include an anode, an organic light-emitting layer, and a cathode which are sequentially laminated. The multilayered functional film layer may include a buffer layer, a first gate insulating layer, a second gate insulating layer, an interlayer dielectric layer, a planarization layer, and a pixel defining layer which are sequentially laminated in a direction distal from the base substrate.

In step 902, a plurality of sub-openings sequentially communicated in the lamination direction of the multilayered functional film layer are formed in the multilayered functional film layer.

In the embodiment of the present disclosure, the area of the opening end surface of each sub-opening gradually increases in a direction distal from the base substrate. Optionally, the plurality of sub-openings may correspond to the multilayered functional film layer one by one, that is, one opening is formed in each functional film layer.

Exemplarily, a plurality of sub-openings may be formed in the multilayered functional film layer by multiple patterning processes. Each patterning process is configured to form one sub-opening. One patterning process may include photoresist coating, exposure, development, etching, and photoresist stripping.

Exemplarily, if the multilayered functional film layer include a buffer layer, a first gate insulating layer, a second gate insulating layer, an interlayer dielectric layer, a planarization layer, and a pixel defining layer which are sequentially laminated on the base substrate, and then by six patterning processes, the opening penetrating through the multilayered functional film layer may be formed in the multilayered functional film layer.

In step 903, a light-shielding film is formed on a sidewall of the opening.

Exemplarily, a light-shielding thin film may be formed on the base substrate in which the opening is formed by a process such as deposition, coating, or sputtering, and then the light-shielding thin film is subjected to the single patterning process to form the light-shielding film on the side wall of the opening. One patterning process may include photoresist coating, exposure, development, etching, and photoresist stripping.

In summary, in the method for manufacturing the display substrate according to the embodiment of the present disclosure, a multilayered functional film layer is formed on the base substrate; afterwards an opening penetrating through the multilayered functional film layer is formed in the multilayered functional film layer; and then a light-shielding film is formed on the side wall of the opening. When the display substrate emits light, the light incident to the opening from the display substrate may be blocked by the light-shielding film. Therefore, the light emitted from the display substrate may be prevented from being incident to the opening without increasing the opening, such that the image quality acquired by the camera in the display device made of the display substrate is relatively high without affecting the screen-to-body ratio of the display device.

Figure 10:
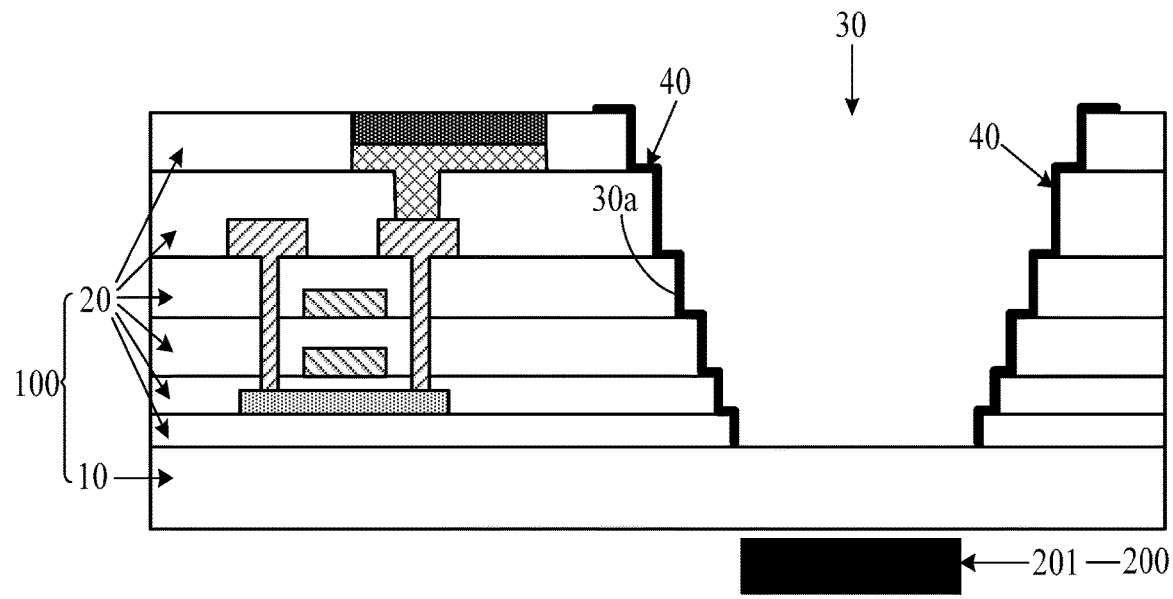
FIG. 10 is a schematic structural diagram of a display device according to an embodiment of the present disclosure.

An embodiment of the present disclosure also provides a display device. As shown in FIG. 10, FIG. 10 is a schematic structural diagram of a display device according to an embodiment of the present disclosure. The display device may be any product or component with a display function such as an electronic paper, a mobile phone, a tablet computer, a television, a display, a laptop computer, a digital photo frame, or a navigator.

The display device may include a display substrate 100 and a sensor device 200. The display substrate 100 may include the display substrate 100 shown in FIG. 3, FIG. 6, or FIG. 7. The sensor device 200 is on one side in the display substrate 100 where the multilayered functional film layer 20 is not provided, and the sensor device is proximal to the opening 30 in the display substrate 100.

Exemplarily, the sensor device 200 may include a camera 201, and an orthogonal projection of the light incident surface of the camera 201 on the base substrate 10 falls within the opening end surface of the opening 30 proximal to the base substrate 10.

Optionally, the orthogonal projection of the light incident surface of the camera 201 on the base substrate 10 completely coincides with the opening end surface of the opening 30 proximal to the base substrate 10. In this case, the screen-to-body ratio of the display device is relatively high.

It should be noted that in the accompanying drawings, for clarity of the illustration, the dimension of the layers and regions may be scaled up. It may be understood that when an element or layer is described as being "above" another element or layer, the described element or layer may be directly on the other element or layer, or at least one intermediate layer may be arranged between the described element or layer and the other element or layer. In addition, It may be understood that when an element or layer is described as being "below" another element or layer, the described element or layer may be directly below the other element or layer, or at least one intermediate layer may be arranged between the described element or layer and the other element or layer. In addition, it may be further understood that when a layer or element is described as being arranged "between" two layers or elements, the described layer or element may be the only layer between the two layers or elements, or at least one intermediate layer or element may be arranged between the described element or layer and the two layers or elements. In the whole specification described above, like reference numerals denote like elements.

In the present disclosure, the terms "first" and "second" are used for descriptive purposes only and are not to be construed as indicating or implying relative importance. The term "plurality" refers to two or more, unless specifically defined otherwise.

Described above are merely exemplary embodiments of the present disclosure, and are not intended to limit the present disclosure. Within the spirit and principles of the disclosure, any modifications, equivalent substitutions, improvements, or the like are within the protection scope of the present disclosure.

What is claimed is:

1. A display substrate, comprising:
   a base substrate;
   a multilayered functional film layer on the base substrate, the multilayered functional film layer being provided with an opening penetrating through the multilayered functional film layer; and
   a light-shielding film on a side wall of the opening; wherein
   the display substrate further comprises light-emitting devices arranged around the opening, an edge of the light-shielding film covers a surface of the multilayered functional film layer away from the base substrate, the edge of the light-shielding film is arranged between the light-emitting devices and the opening, and a gap is formed between the edge of the light-shielding film and the light-emitting devices.

2. The display substrate according to claim 1, wherein the opening comprises a plurality of sub-openings sequentially communicated in a lamination direction of the multilayered functional film layer, and central axes of the plurality of sub-openings coincide.

3. The display substrate according to claim 2, wherein in the plurality of sub-openings, an area of an opening end surface of a first sub-opening is greater than an area of an opening end surface of a second sub-opening, the first sub-opening being adjacent to the second sub-opening, and the first sub-opening being on one side of the second sub-opening distal from the base substrate.

4. The display substrate according to claim 1, wherein a material of the light-shielding film comprises a metal material.

5. The display substrate according to claim 4, wherein the material of the light-shielding film comprises any one of silver, aluminum, and an alloy.

6. The display substrate according to claim 1, further comprising a plurality of pixel driving circuits on the base substrate, and the light-emitting devices are electrically connected to the pixel driving circuits.

7. The display substrate according to claim 6, wherein the multilayered functional film layer comprises a buffer layer, a first gate insulating layer, a second gate insulating layer, an interlayer dielectric layer, a planarization layer, and a pixel defining layer which are sequentially laminated on the base substrate.

8. The display substrate according to claim 1, wherein the side wall of the opening is a stepped side wall.

9. The display substrate according to claim 1, wherein the side wall of the opening is a flat side wall.

10. The display substrate according to claim 1, wherein a material of the light-shielding film comprises a non-metal material.

11. The display substrate according to claim 10, wherein the material of the light-shielding film comprises a black resin.

12. The display substrate according to claim 1, wherein the opening comprises a plurality of sub-openings sequentially communicated in a lamination direction of the multilayered functional film layer, the plurality of sub-openings being in the multilayered functional film layer in one-to-one correspondence, in the plurality of sub-openings, an area of an opening end surface of a first sub-opening being greater than an area of an opening end surface of a second sub-opening, the first sub-opening being adjacent to the second sub-opening, the first sub-opening being on one side of the second sub-opening distal from the base substrate, and central axes of the plurality of sub-openings coinciding; and
   a material of the light-shielding film comprises a metal material.

13. A display device, comprising: a sensor device and a display substrate; wherein the display substrate comprises a base substrate, a multilayer functional film layer being provided with an opening penetrating through the multilayered functional film layer, and a light shielding film on a side wall of the opening; the sensor device is on the other side opposite to one side of the base substrate which the multilayered functional film layer is on; and an orthogonal projection of the sensor device on the base substrate at least partially overlaps a region which the opening is on; wherein
   the multilayered functional film layer is on the base substrate;
   the display substrate further comprises light-emitting devices arranged around the opening, an edge of the light-shielding film covers a surface of the multilayered functional film layer away from the base substrate, the edge of the light-shielding film is arranged between the light-emitting devices and the opening, and a gap is formed between the edge of the light-shielding film and the light-emitting devices.

14. The display device according to claim 13, wherein the sensor device comprises: a camera, an orthogonal projection of a lens of the camera on the base substrate overlaps the region which the opening is on.

15. The display device according to claim 14, wherein the orthogonal projection of the lens of the camera on the base substrate coincides with the region which the opening is on.

16. The display substrate according to claim 1, wherein a size of the opening gradually increases in a first direction, the first direction being a direction perpendicular to a surface of the base substrate provided with the multilayered functional film layer, and distal from the base substrate.

17. The display substrate according to claim 1, wherein the opening comprises a plurality of sub-openings sequentially communicated in a lamination direction of the multilayered functional film layer, the plurality of sub-openings being in the multilayered functional film layer in one-to-one correspondence.

18. The display substrate according to claim 17, wherein an angle between a side wall of each of the plurality of sub-openings and the base substrate is a right angle, and a thickness of the light-shielding film on the side wall of the opening is the same.

* * * * *